United States Patent [19]

Hamada

[11] 3,908,174

[45] Sept. 23, 1975

[54] FREQUENCY AND PHASE COMPARATOR

[75] Inventor: Osamu Hamada, Tokyo, Japan

[73] Assignee: Sony Corporation, Tokyo, Japan

[22] Filed: Jan. 25, 1974

[21] Appl. No.: 436,514

[30] Foreign Application Priority Data

Jan. 29, 1973 Japan .............................. 48-11766

[52] U.S. Cl. ...................... 331/11; 331/17; 331/26

[51] Int. Cl.[2] ........................................... H03B 3/06

[58] Field of Search ...................... 331/26, 2, 11, 17

[56] References Cited

UNITED STATES PATENTS

| | | | |
|---|---|---|---|
| 3,212,023 | 10/1965 | Broadhead, Jr. | 331/11 |
| 3,458,823 | 7/1969 | Nordahl | 331/11 |
| 3,586,992 | 6/1971 | Garfein | 331/17 |
| 3,605,033 | 9/1971 | Nakamura | 331/26 |
| 3,619,804 | 11/1971 | Mears | 331/26 |
| 3,703,686 | 11/1972 | Hekimian | 331/11 |

FOREIGN PATENTS OR APPLICATIONS

| | | | |
|---|---|---|---|
| 841,462 | 7/1960 | United Kingdom | 331/11 |

OTHER PUBLICATIONS

Sourcebook of Electronic Circuits, J. Markus, Publ. by McGraw-Hill Book Co., 1969, pg. 702.

*Primary Examiner*—John Kominski
*Attorney, Agent, or Firm*—Hill, Gross, Simpson, Van Santen, Steadman, Chiara & Simpson

[57] ABSTRACT

A frequency and phase comparator which includes a frequency discriminator and a phase comparator, which is suitable for use in a phase locked loop. The phase comparator produces an output signal proportional to the phase difference between the output signal of a reference oscillator and the output signal of a voltage controlled oscillator when the difference in frequency is within a predetermined range. The frequency discriminator produces a control signal proportional to the frequency difference between the voltage controlled oscillator and reference oscillator, and the control signal is used for increasing or decreasing the frequency of the voltage controlled oscillator.

6 Claims, 13 Drawing Figures

FREQUENCY AND PHASE COMPARATOR

BACKGROUND OF THE INVENTION

1. Field of the Invention

This invention relates in general to a frequency and phase comparator, and is directed more particularly to a frequency and phase comparator which is suitable for a phase locked loop.

2. Description of the Prior Art

In the prior art, a phase comparator for a phase locked loop is provided for detecting the phase and frequency difference between a voltage controlled oscillator and a reference oscillator and the frequency and phase of the voltage controlled oscillator are controlled by the phase comparator through a low pass filter so as to be coincident with the phase of the reference oscillator when the frequency difference is within a predetermined capture range. The circuit does not control when the frequency difference exceeds the capture range of the phase locked loop. Attempts to broaden the capture range by extending the bandwidth of the low pass filter have been tried, but usually this gives rise to noise interference.

SUMMARY OF THE INVENTION

An object of the present invention is to provide a frequency and phase comparator which eliminates the defects encountered in the prior art.

Another object of the invention is to provide a frequency and phase comparator which has a short lock-in time and improved response characteristics.

A further object of the invention is to provide a frequency and phase comparator which has an extended capture range, so that it operates with two signals which have a large frequency difference.

A still further object of the invention is to provide an improved frequency and phase comparator which has a frequency discriminator and a phase comparator, and the frequency discriminator comprises means for converting frequency difference into a DC voltage when the frequency difference exceeds a predetermined range, and the phase comparator comprises a sawtooth wave oscillator and a sampling circuit and produces a DC voltage proportional to the phase difference when the frequency difference is within the predetermined capture range.

Other objects, features and advantages of the invention will be readily apparent from the following description of certain preferred embodiments thereof, taken in conjunction with the accompanying drawings.

DESCRIPTION OF THE PREFERRED EMBODIMENT

The present invention will now be described with reference to FIG. 1, which shows in block form, the general concept of the invention. A variable voltage controlled oscillator 1 has an output which is supplied to a frequency discriminator 4 and to a phase comparator 3. Phase comparator 3 also receives a reference signal from a reference oscillator 2.

The frequency discriminator 4 detects whether the frequency of the output signal from the voltage controlled oscillator 1 is within a predetermined capture range. The output of the frequency discriminator 4 is applied to the phase comparator 3 to lock its output to a maximum or minimum based upon the output from the frequency discriminator 4.

Figure 2:
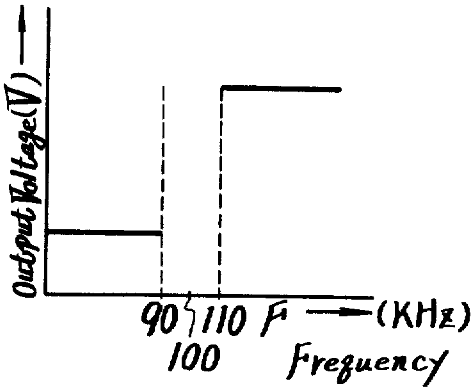
FIG. 2 is a graph used for the explanation of the example of the invention shown in FIG. 1.

In a practical embodiment, if the output of the reference oscillator 2 is 100KHz, the range over which control is accomplished is 100KHz ± 10KHz and the output frequency of oscillator 1 is increased in frequency by a low level control voltage and decreased in frequency by a high level control voltage. The frequency discrimination or detecting function of the present invention is shown in FIG. 2, in which the abscissa represents the frequency F in KHz and the ordinate the control DC voltage V. When the output frequency of the controlled voltage oscillator 1 is lower than 90KHz, a minimum voltage is applied to the oscillator 1 from the phase comparator 3 until the output frequency of the oscillator 1 exceeds 90KHz. When the output frequency of the oscillator 1 is higher than 110 KHz, the maximum voltage is applied to oscillator 1 from phase comparator 3 until its frequency becomes lower than 110 KHz.

With the present invention which has the frequency discrimination response shown in FIG. 2 control can be accomplished even if a large frequency difference exists between two signals, and they can be controlled and be made coincident in phase with each other.

FIGS. 3 to 6 illustrate a practical embodiment of the present invention.

Figure 1:
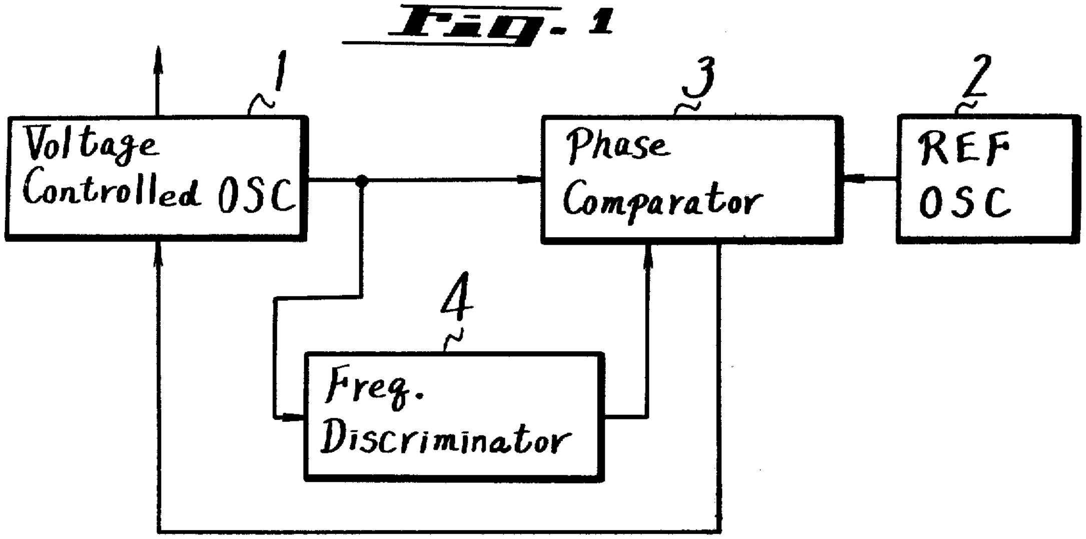
FIG. 1 is a schematic block diagram showing an example of frequency and phase comparators according to the present invention.
Figure 3:
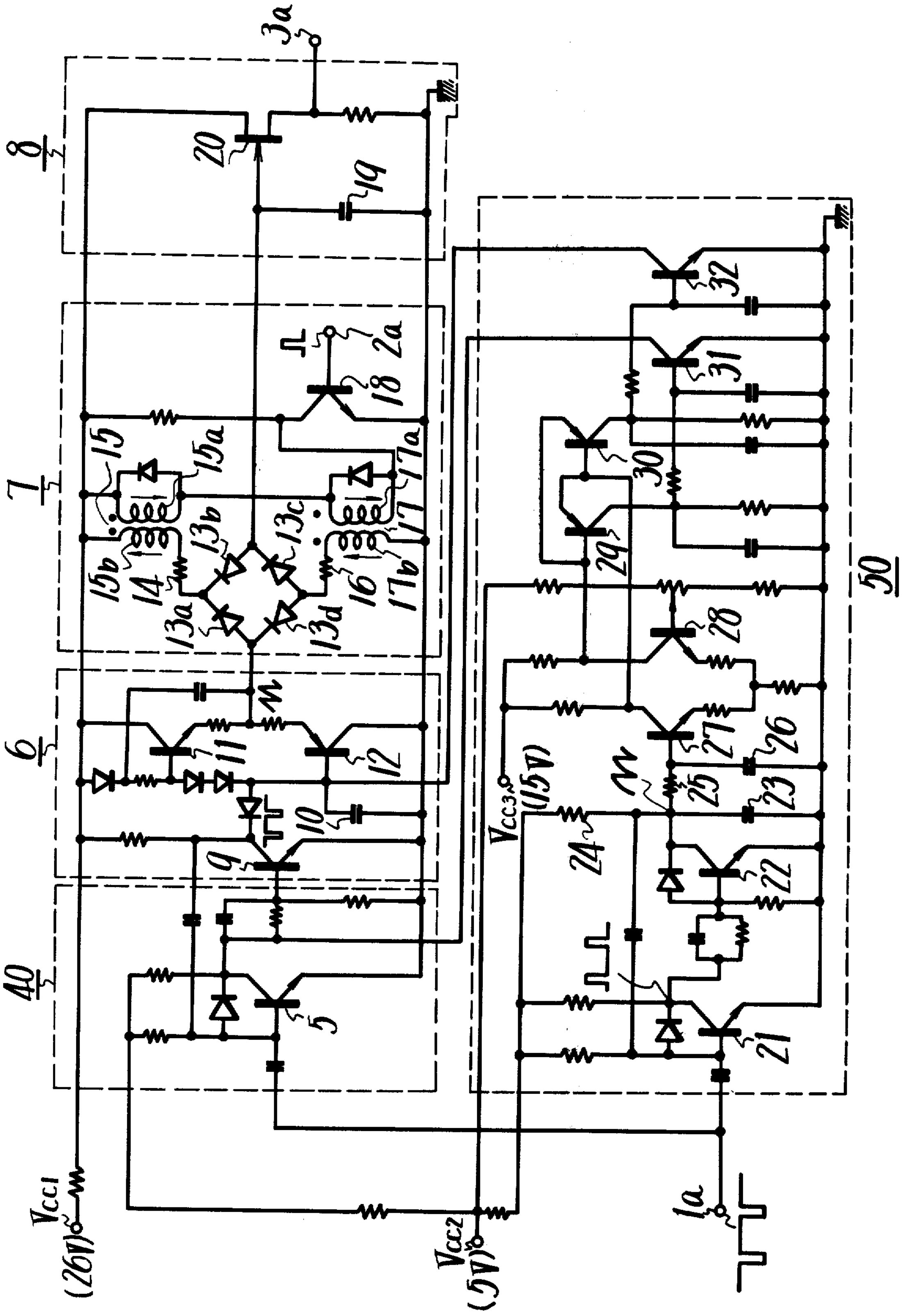
FIG. 3 is an electrical schematic diagram for showing a practical example of the frequency and phase comparator according to the present invention.

In FIG. 3, a terminal 1*a* is supplied the output signal of voltage controlled oscillator 1 shown in FIG. 1 is applied. A terminal 2*a* receives the output signal of reference oscillator 2 shown in FIG. 1, and a terminal 3*a* is an output terminal where a compared output or a control voltage for the voltage controlled oscillator 1 is obtained. Terminals $V_{cc1}$, $V_{cc2}$, and $V_{cc3}$ are input terminals to which voltages of 26V, 5V and 15V are applied, respectively.

Figures 4A, 4B, 4C, 4D:
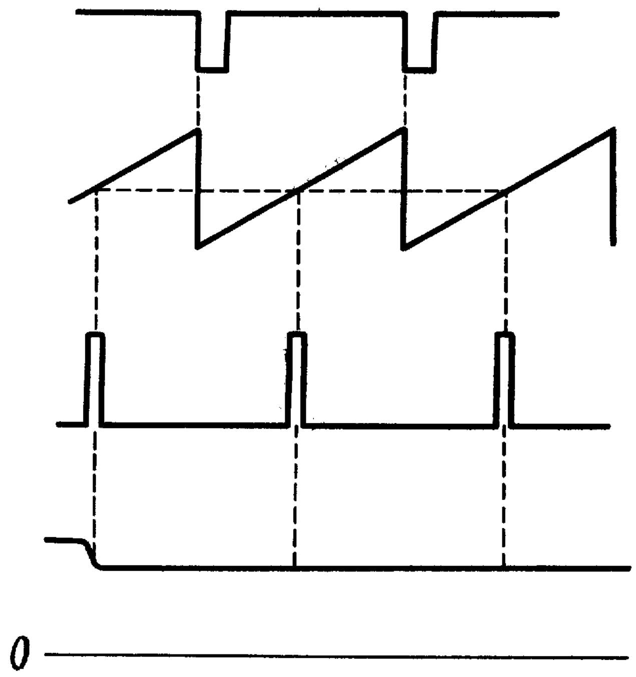
FIGS. 4A through 4D, FIGS. 5A through 5C and FIGS. 6A through 6C are graphs used for the explanation of the example shown in FIG. 3.

The output of voltage controlled oscillator 1 applied to the terminal 1a is fed through a capacitor to the base of a transistor 5 of a phase inverter 40 which inverts its phase and supplies it to the base electrode of a transistor 9 in a Bootstrap circuit 6. The phase comparator 3 (refer to FIG. 1) is formed by circuit 6, a sampling gate circuit 7 and a sampling hold circuit 8. When the transistor 9 of Bootstrap circuit 6 is made nonconductive, a capacitor 10 is charged gradually with the 26 volt voltage from terminal $V_{cc1}$, and when the transistor 9 is made conductive, the charge stored in the capacitor 10 will be discharged through transistor 9. As a result, at the connection point between the emitter electrodes of an NPN-type transistor 11 and a PNP-type transistor 12, which are complementally connected so as to reduce the output impedance and shorten the charging time period of Bootstrap circuit 6, there is obtained a sawtooth wave signal. The transistors 11 and 12 are coupled to capacitor 10 and transistor 9 as shown. FIG. 4A shows the output signal of voltage controlled oscillator 1 which is applied to the terminal 1a and FIG. 4B shows the sawtooth wave signal applied from the Bootstrap circuit 6 to the sampling gate circuit 7 from one connection point of the emitters of transistors 11 and 12.

The sampling gate circuit 7 includes a bridge rectifier consisting of diodes 13a, 13b, 13c and 13d. In the diode bridge, the anode electrode of diode 13a and the cathode electrode of diode 13d are connected together and form the input terminal to which the sawtooth wave signal is applied from Bootstrap circuit 6. The connection point between the anode electrode of diode 13b and the cathode electrode of diode 13c is the output terminal to which the sampling hold circuit 8 is connected. The connection point between the cathode electrodes of diodes 13a and 13b is connected to the terminal $V_{cc1}$ through a resistor 14 and a secondary coil 15b of a pulse transformer 15. The connection point between the anode electrodes of diodes 13c and 13d is grounded through a resistor 16 and a secondary coil 17b of a pulse transformer 17. Primary coils 15a and 17a of pulse transformers 15 and 17 are connected in series between the collector electrode of a transistor 18 and the terminal $V_{cc1}$. The base electrode of transistor 18 is supplied with the output signal of reference oscillator 2, shown in FIG. 1, at the terminal 2a.

The sampling hold circuit 8 includes a hold capacitor 19 and a field effect transistor 20 of high input impedance. The output terminal of sampling gate circuit 7 including the diode bridge is grounded through the capacitor 19 and is also connected to the gate electrode of field effect transistor 20.

Sampling gate circuit 7 operates as follows. When the output signal of the reference frequency oscillator 2 is applied to the input terminal 2a of sampling gate circuit 7, it compares the voltage level of the input and output signals. If the input and output signals are equal in voltage level, equal current flows through the diode pairs 13a, 13d and 13b, 13c, respectively. However, if the input voltage is higher than the output voltage, the capacitor 19 will be charged, and if the input voltage is lower than the output voltage, the charge stored in the capacitor 19 will be discharged. As shown in FIG. 4D, the output voltage appears at terminal 3a, which is connected to the source electrode of field effect transistor 20 in the sampling hold circuit 8, and has an amplitude which depends upon the phase difference between the output of voltage controlled oscillator 1 shown in FIG. 4A and the output of reference oscillator 2 or the sampling pulse shown in FIG. 4C. The output voltage delivered to terminal 3a is fed back to the voltage controlled oscillator 1 as shown in FIG. 1 to control the phase difference so that it will be substantially zero.

It is to be noted that the pulse signal applied to the terminal 2a of sampling gate circuit 7 is isolated from the output terminal 3a of sampling hold circuit 8. In other words, if the number of turns of the primary and secondary coils of pulse transformers 15 and 17 is selected to be equal, the currents flowing through secondary coils 15b and 17b, when the transistor 18 turns on, will be equal. Thus, the current flowing into the diodes 13a to 13d caused by the output voltage from Bootstrap circuit 6, when the diodes 13a to 13d are made conductive, will be equal to that flowing out from the diodes 13a to 13d with the result that the voltage across the capacitor 19 is not affected by the pulse signal applied to the terminal 2a.

The frequency discriminator of the present invention operates as follows. With the frequency discriminator of the embodiment shown in FIG. 3, it produces the minimum voltage as the control voltage when the oscillation frequency of the voltage controlled oscillator is excessively low, and produces the maximum voltage as the control voltage when the oscillation frequency of the voltage controlled oscillator is excessively high. If the base voltage of transistor 9 of Bootstrap circuit 6 is fixed at the ground voltage, the output voltage of Bootstrap circuit 6 is fixed or locked at the maximum voltage. Thus, the control voltage obtained from the terminal 3a is also fixed or locked at the maximum voltage. If the base electrodes of transistors 11 and 12 are grounded, the control voltage is fixed or locked at the minimum voltage.

The construction of the frequency discriminator, which is designated 50 as a whole in FIG. 3, will now be described. The output signal of voltage controlled oscillator 1 is applied to the terminal 1a and is fed to the base electrode of a transistor 21 through a capacitor. The output signal appearing at the collector electrode of transistor 21 is applied to the base electrode of a transistor 22 which has its collector electrode grounded through a capacitor 23. This collector electrode is also connected to the terminal $V_{cc2}$ through a resistor 24. Thus, the capacitor 23 is charged when the transistor 22 is nonconductive and a sawtooth wave signal as shown in FIG. 3, is produced at the connection point between the capacitor 23 and resistor 24. This sawtooth wave signal is integrated by an integration circuit formed of a resistor 25 and a capacitor 26 and is applied to the base electrode of a transistor 27 which forms a differential amplifier together with a transistor 28. The base electrode of transistor 28 is supplied with a reference DC voltage from the terminal $V_{cc2}$.

Figure 5A:
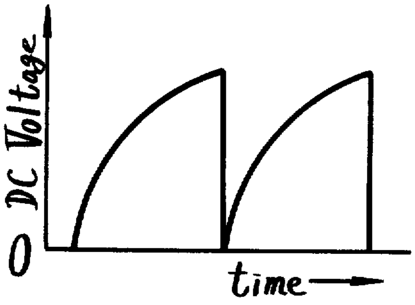
Figure 6A:
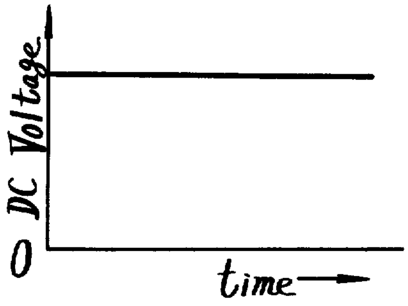
Figure 5B:
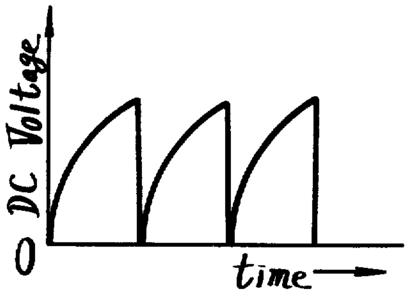
Figure 6B:
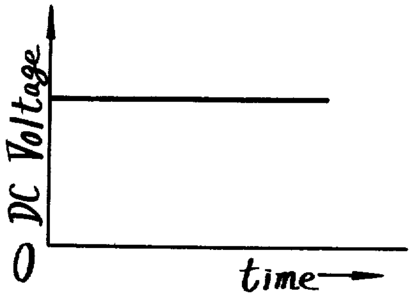
Figure 5C:
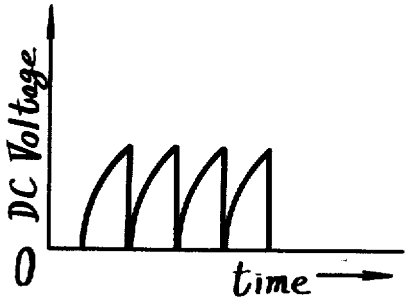
Figure 6C:
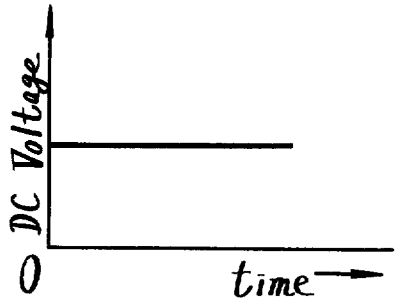

FIGS. 5A, 5B and 5C show sawtooth wave signals produced at the connection point between the capacitor 23 and resistor 24 in response to outputs having different frequencies from the voltage controlled oscillator 1. The sawtooth wave signal shown in FIG. 5B illustrates the case where the frequency is the reference, for example, 100KHz. The curve shown in FIG. 5A is for the case where the frequency is lower than the reference frequency; and that shown in FIG. 5C is for the case where the frequency is higher than the reference frequency. Since these sawtooth wave signals are integrated as previously described, the DC voltage shown in FIG. 6B is obtained and is applied to the base electrode of transistor 27, when the frequency of the output from voltage controlled oscillator 1 is at the reference frequency. The DC voltages shown in FIGS. 6A and 6C are applied to the base electrode of transistor 27 when the frequency is lower and higher, respectively, than the reference frequency. The DC voltage applied to the base electrode of transistor 28 is selected to be equal to that applied to the base electrode of transistor 27 when the DC voltage shown in FIG. 6B corresponds to the reference frequency.

The collector electrode of transistor 27 is connected to the emitter electrode of a PNP-type transistor 29 and also to the base electrode of a PNP-type transistor 30. The collector electrode of transistor 28 is connected to the base electrode of transistor 29 and also to the emitter electrode of transistor 30.

The collector electrode of transistor 29 is grounded through a resistor and is connected to the base electrode of a transistor 31. The emitter electrode of transistor 31 is grounded. The collector electrode of transistor 30 is grounded through a resistor and connected through a resistor to the base electrode of a transistor 32 which has its emitter electrode grounded. The collector electrode of transistor 31 is connected to the base electrode of transistor 9 in the Bootstrap circuit 6. The collector electrode of transistor 32 is connected to the connection point between the base electrodes of transistors 11 and 12 in the Bootstrap circuit 6.

With the frequency discriminator 50 described above, if the frequency of output from the voltage controlled oscillator is within a predetermined range of the reference frequency (100 ± 10KHz), equal DC voltage will be applied to the base electrodes of transistors 27 and 28 which form the differential amplifier, so that equal current flows through both transistors 27 and 28. As a result, the base and emitter voltages of transistors 29 and 30 are equal and hence the transistors 29 and 30 are nonconductive. The transistors 31 and 32 will also be nonconductive. In this state, the phase control operation described previously is performed.

If the frequency of the output from the voltage controlled oscillator 1 exceeds the predetermined range of the reference frequency in the lower direction, high current flows through transistor 27 which lowers its collector voltage to a valve lower than that of transistor 28 and consequently transistor 30 will be made conductive. As a result, the transistor 32 is made conductive and the bases of transistors 11 and 12 drop to ground voltage which makes the output of the Bootstrap circuit 6 minimum. Thus, the control voltage derived from the terminal 3*a* becomes minimum and the voltage controlled oscillator 1 is controlled so as to increase its oscillation frequency.

On the contrary, if the oscillation frequency of voltage controlled oscillator 1, exceeds the predetermined range of the reference frequency in the higher direction, the collector voltage of transistor 28 becomes lower than that of transistor 27 and consequently the transistor 29 is made conductive. This makes the transistor 31 conductive which drops the base voltage of transistor 9 to ground and the output of Bootstrap circuit 6 is at the maximum voltage. As a result, the control voltage appearing at the terminal 3*a* becomes maximum which controls the voltage controlled oscillator 1 in such a manner that its oscillation frequency is lowered.

When the oscillation frequency of the voltage controlled oscillator 1 is controlled and the difference between its output frequency and the reference frequency falls within the predetermined capture range, for example, within the range of 90–110KHz, both transistors 29 and 30 are made nonconductive and normal phase control occurs. The deviation of ± 10KHz from the reference frequency is caused by the voltage drop $V_{BE}$ across the base-emitter of transistor 29 or 30. The voltage drop $V_{BE}$ is about 0.7V if the transistors 29 and 30 are made of silicon. When the output frequency from the voltage controlled oscillator 1 is within the deviation of ± 10KHz from the reference frequency, the voltage across the base-emitter of transistor 29 or 30 is selected such that the transistor does not conduct.

With the present invention, two signals which greatly differ in frequency can be compared, and the present invention is applicable to a synthesizer receiver employing frequency synthesizing techniques.

Further, with the present invention when the frequency difference between two signals to be compared exceeds a predetermined range, the frequency of the voltage controlled oscillator is controlled until it lies within the predetermined range, by the output from the frequency discriminator, and thereafter, the phase comparing operation is performed by the phase comparator. As a result, the lock in time is greatly reduced and the phase comparator for the capture range can be easily designated.

It will be apparent to those skilled in the art that many modifications and variations could be effected without departing from the spirit and scope of the novel concepts of the present invention.

I claim as my invention:

1. A frequency and phase comparator comprising:

a. a reference signal oscillator, b. a voltage controlled oscillator producing a rectangular wave signal, c. means for generating a sawtooth wave signal supplied with said rectangular wave signal, said sawtooth wave signal having the same frequency as that of said rectangular wave signal, d. a sampling and hold circuit supplied with said sawtooth wave signal and said reference signal and producing a DC signal proportional to the phase difference therebetween, said DC signal being supplied to said voltage controlled oscillator so as to phase lock its phase with respect to that of reference signal within a predetermined value, e. means for discriminating the frequency difference of said reference signal and said rectangular wave signal and producing an output signal when the frequency difference exceeds a predetermined range, f. control means supplied with said output signal so as to hold the amplitude of said sawtooth wave signal at its maximum or minimum values; whereby said frequency of said voltage controlled oscillator is controlled until the frequency difference falls within said predetermined frequency range.

2. A frequency and phase comparator according to claim 1, wherein said frequency discriminator comprises:

a. a sawtooth wave signal generator receiving said rectangular wave signal from said voltage controlled oscillator, b. rectifying means receiving said sawtooth wave signal and producing a DC signal proportional to the frequency thereof, c. a DC voltage comparator receiving said DC signal and a reference DC signal, and d. switching means receiving an output signal of said DC voltage comparator and producing a control signal for controlling the amplitude of the sawtooth wave signal of said sawtooth wave signal generating means.

3. A frequency and phase comparator according to claim 2, wherein said DC voltage comparator includes a differential amplifier and said switching means includes a plurality of switching transistors.

4. A frequency and phase comparator according to claim 3, wherein said differential amplifier comprises first and second transistors with their base electrodes receiving said DC signal and said reference DC signal, the collector and emitter electrodes of said first and second transistors connected between ground and a voltage source through a common emitter resistor and collector loads, respectively, said switching transistors includes a third transistor whose base and emitter electrodes are connected between the collector electrode of one of said first and second transistors and the collector electrode of the other of said first and second transistors, respectively, and its collector electrode connected to one terminal of said voltage source through a collector load, and a fourth transistor whose base and emitter electrodes are connected between said collector electrode of said other one of first and second transistors and collector electrode of said one of said first and second transistors, respectively, and its collector electrode connected to said one terminal of said voltage source through a collector load whereby said control signal is produced across said collector loads of said third and fourth transistors.

5. A frequency and phase comparator according to claim 1, wherein said sampling and hold circuit comprises:

a. a diode bridge circuit having at least four diodes which are connected with the same polarity to each other, and having an input terminal connected to a first connection point thereof and an output terminal connected to a second connection point thereof; said input terminal being supplied with said sawtooth wave signal, b. a pair of pulse transformers each having primary and secondary windings, with each secondary winding being connected between a third connection point of said diode bridge circuit and one terminal of a voltage source, and between a fourth connection point of said diode bridge circuit and the other terminal of said voltage source, respectively, a switching transistor, said each primary windings being connected across said terminals of said voltage source through the collector and emitter electrodes of said switching transistor, said reference signal supplied to the base electrode of said switching transistor, c. a capacitor connected between said output terminal of said diode bridge circuit and a reference point; whereby said output terminal produces said DC signal proportional to the phase difference between said reference signal and said sawtooth wave signal.

6. A frequency and phase comparator circuit according to claim 5 including a field effect transistor with its gate connected to the output terminal of said diode bridge and its drain electrode connected to a voltage source, a load resistor connected between its source electrode and ground and an output terminal connected to said source for supplying said DC signal proportional to the phase difference between said reference signal and said sawtooth wave signal and supplied to said voltage controlled oscillator to control it.

* * * * *